United States Patent
Yang et al.

(10) Patent No.: US 7,851,249 B2
(45) Date of Patent: Dec. 14, 2010

(54) TANDEM SOLAR CELL INCLUDING AN AMORPHOUS SILICON CARBIDE LAYER AND A MULTI-CRYSTALLINE SILICON LAYER

(75) Inventors: Tsun-Neng Yang, Taipei (TW); Shan-Ming Lan, Taoyuan County (TW); Chin-Chen Chiang, Taoyuan County (TW); Wei-Yang Ma, Banqiao (TW); Chien-Te Ku, Pingzhen (TW); Yu-Hsiang Huang, Pingzhen (TW)

(73) Assignee: Atomic Energy Council - Institute of Nuclear Energy Research, Taoyuan (TW)

( * ) Notice: Subject to any disclaimer, the term of this patent is extended or adjusted under 35 U.S.C. 154(b) by 0 days.

(21) Appl. No.: 11/980,749

(22) Filed: Oct. 31, 2007

(65) Prior Publication Data

US 2010/0216274 A1  Aug. 26, 2010

(51) Int. Cl.
    *H01L 31/42* (2006.01)
(52) U.S. Cl. .............. 438/57; 257/431; 257/E27.122; 257/E27.123

(58) Field of Classification Search .......... 438/57, 438/97, 98, 488; 257/428, 431, 458, 461, 257/E21.09, E27.122, E27.123, E27.124, 257/E25.007
See application file for complete search history.

(56) References Cited

U.S. PATENT DOCUMENTS

| | | | | |
|---|---|---|---|---|
| 3,961,997 A | * | 6/1976 | Chu | ............................ 438/97 |
| 4,496,788 A | * | 1/1985 | Hamakawa et al. | ......... 136/249 |
| 5,180,434 A | * | 1/1993 | DiDio et al. | ................. 118/718 |

FOREIGN PATENT DOCUMENTS

JP          2005286067 A    * 10/2005

* cited by examiner

*Primary Examiner*—Matthew S Smith
*Assistant Examiner*—Michele Fan
(74) *Attorney, Agent, or Firm*—Jackson IPG PLLC; Demian K. Jackson (57) ABSTRACT

A method for making a tandem solar cell includes the steps of providing a ceramic substrate, providing a titanium-based layer on the ceramic substrate, providing an $n^+$-$p^-$-$p^+$ laminate on the titanium-based layer, passivating the $n^+$-$p^-$-$p^+$ laminate, providing an n-i-p laminate on the $n^+$-$p^-$-$p^+$ laminate, providing a p-type ohmic contact, providing an n-type ohmic contact providing an anti-reflection layer of $SiCN/SiO_2$ on the n-i-p laminate.

10 Claims, 13 Drawing Sheets

TANDEM SOLAR CELL INCLUDING AN AMORPHOUS SILICON CARBIDE LAYER AND A MULTI-CRYSTALLINE SILICON LAYER

BACKGROUND OF INVENTION

1. Field of Invention

The present invention relates to a solar cell and, more particularly, to a tandem solar cell including an amorphous silicon carbide laminate and a multi-crystalline silicon laminate.

2. Related Prior Art

Most silicon-based solar cells are made in low-temperature processes based on plasma-enhanced chemical vapor deposition ("PECVD"). An amorphous silicon or multi-crystalline silicon layer is coated on a glass, aluminum, silicon, stainless steel or plastic substrate. A back contact is made of aluminum, gold, silver or transparent conductive oxide such as indium-tin oxide ("ITO") and zinc oxide.

The primary advantage of the low-temperature processes is the wide variety of materials that can be used to make the substrates. However, they suffer drawbacks such as defective silicon layers, low photoelectrical conversion efficiencies and low light-soaking stability. In the PECVD, while coating the microcrystalline silicon layer, a silicon material is highly diluted in hydrogen according to the following notion:

$$[H_2]/[SiH_4] > 15$$

That is, the concentration or flow rate of $H_2$ is more than 15 times as high as that of $SiH_4$. The problems with the PECVD are a low growth rate of the layer, a long process and a high cost.

Regarding the making of the multi-crystalline silicon solar cells, there are various techniques such as solid phase crystallization ("SPC") and aluminum-induced crystallization ("AIC"). The SPC is based on the PECVD. An amorphous silicon layer is deposited, intensively heated and annealed at a high temperature. Thus, a multi-crystalline silicon layer with a grain size of 1 to 2 micrometers is made.

In the AIC as shown in FIGS. 10 through 14, a substrate 51 is coated with an aluminum layer 52. An amorphous silicon layer 53 is coated on the aluminum layer 52 based on the PECVD and annealed at a temperature of about 575 degrees Celsius for a long time to form a seeding layer 54. Then, it is subjected to an epitaxial process such as the PECVD or an electron cyclotron resonance chemical deposition ("ECR-CVD") to make a multi-crystalline silicon layer 55. The AIC however involves many steps and takes a long time. The resultant grain size is about 0.1 to 10 micrometers.

A conventional silicon-based tandem solar cell includes an upper laminate and a lower laminate. The upper laminate is an amorphous silicon p-i-n laminate. The lower laminate is a microcrystalline silicon p-i-n laminate. Thus, the infrared and visible light of the sunlit can be converted into electricity. However, the photoelectrical conversion efficiency of the conventional silicon-based tandem solar cell deteriorates quickly.

Regarding the conventional methods for making multi-crystalline silicon solar cells in the low-temperature processes based on the PECVD, there are many defects in the silicon layers, the photoelectrical conversion efficiencies are low, the light soaking stabilities low, the growth rates of the layers low, the processes long, and the costs high. Concerning the method for making multi-crystalline silicon solar cells based on the AIC, the processes are long for including many steps and therefore expensive. As for the conventional silicon-based tandem solar cell, the photoelectrical conversion efficiency deteriorates quickly.

The present invention is therefore intended to obviate or at least alleviate the problems encountered in prior art.

SUMMARY OF INVENTION

It is the primary objective of the present invention is to provide a method for making a tandem solar cell.

To achieve the fore-going objective, the method includes the step of providing a titanium-based layer on a ceramic substrate. An $n^+$-$p^-$-$p^+$ laminate is provided on the titanium-based layer at three steps. Firstly, an atmospheric pressure chemical vapor deposition device is used to depose dichlorosilane and diborane on the titanium-based layer, thus causing the epitaxial growth of a $p^+$-type back surface field layer on the titanium-based layer. Secondly, the temperature is raised, thus causing the epitaxial growth of a $p^-$-type light-soaking layer on the $p^+$-type back surface field layer. Finally, $n^+$-type diffusive deposition of phosphine is conducted on the $p^-$-type light-soaking layer, thus forming an $n^+$-type emitter on the $p^-$-type light-soaking layer. A plasma-enhanced chemical vapor deposition device is used to provide SiCNO:Ar plasma to passivate the $n^+$-$p^-$-$p^+$ laminate. That is, the dangling bonds of the silicon atoms on the surface of the $n^+$-type emitter and on the crystalline boundaries of the $p^+$-type back surface field layer and the $p^-$-type light-soaking layer are filled. An n-i-p laminate is provided on the $n^+$-$p^-$-$p^+$ laminate at three steps. Firstly, a chemical vapor deposition device is used to depose dichlorosilane and diborane on the $n^+$-type emitter, thus forming a p-type amorphous silicon carbide layer on the $n^+$-type emitter. Secondly, inter-doping with non-reactive gas is conducted to form an i-type amorphous silicon carbide intrinsic layer on the p-type amorphous silicon carbide layer. Finally, n-type diffusive deposition of phosphine is conducted on the i-type amorphous silicon carbide intrinsic layer to form an n-type amorphous silicon carbide layer on the i-type amorphous silicon carbide intrinsic layer. Potassium hydroxide solution and a patterned mask are used to etch a portion of the n-i-p laminate, and a p-type ohmic contact is provided. A patterned mask is used to provide a Ti/Pd/Ag layer on the n-type amorphous silicon carbide layer and annealing the Ti/Pd/Ag layer in argon, thus forming an n-type ohmic contact. A patterned mask is used to provide an anti-reflection layer of $SiCN/SiO_2$ on the n-type amorphous silicon carbide layer.

Other objectives, advantages and features of the present invention will become apparent from the following description referring to the attached drawings.

BRIEF DESCRIPTION OF DRAWINGS

The present invention will be described via the detailed illustration of the preferred embodiment referring to the drawings.

DETAILED DESCRIPTION OF PREFERRED EMBODIMENT

Figure 1:
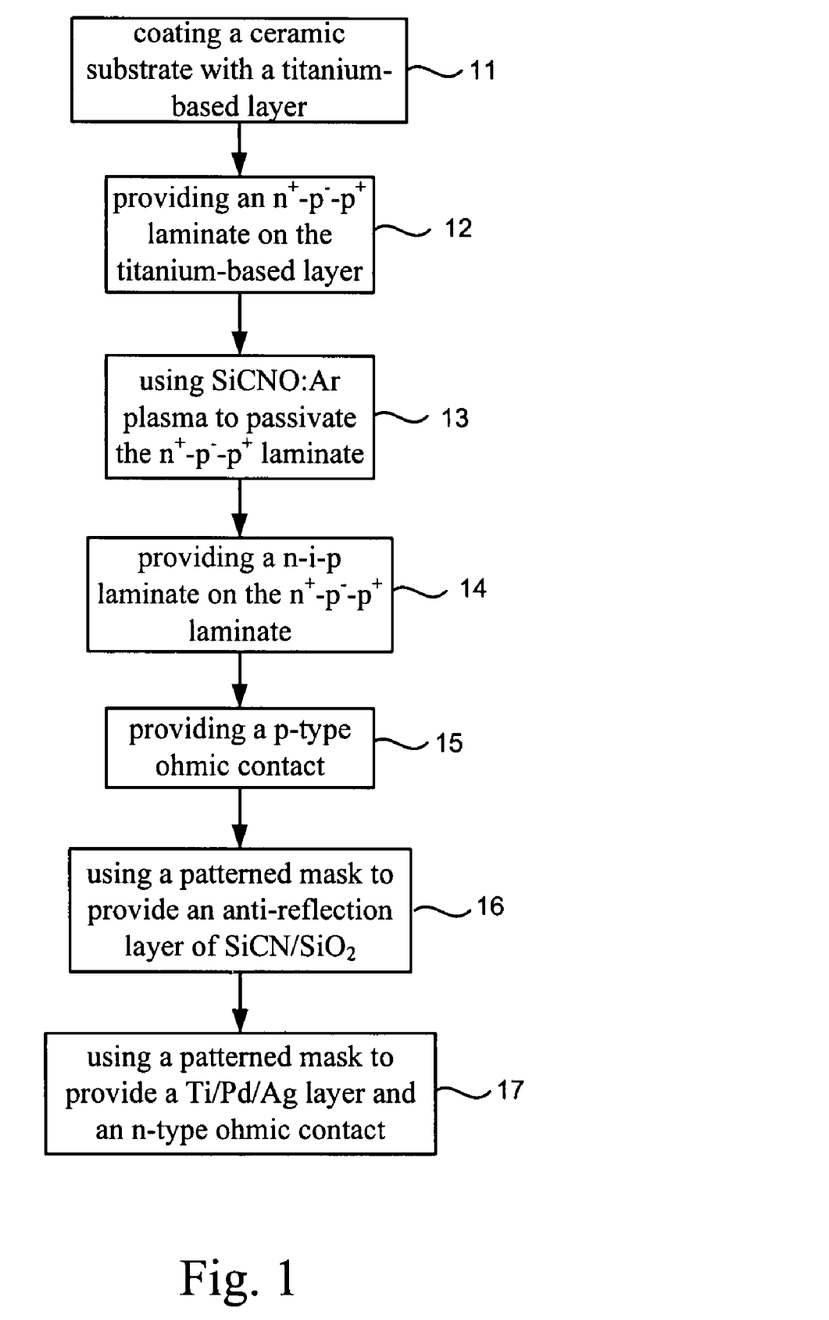
FIG. 1 is a flowchart of a method for making a tandem solar cell according to the preferred embodiment of the present invention.

Referring to FIG. 1, there is shown a method for making a tandem solar cell according to the preferred embodiment of the present invention.

Figure 2:
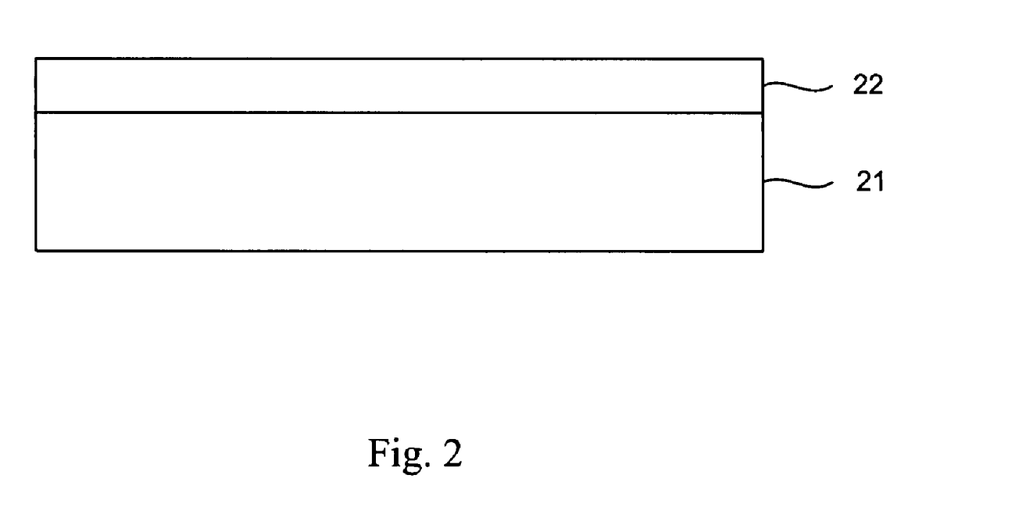
FIG. 2 is a side view of a ceramic substrate and a titanium-based layer coated on the ceramic substrate in the method shown in FIG. 1.

Referring to FIGS. 1 and 2, at 11, a ceramic substrate 21 is provided. The ceramic substrate 21 is made of aluminum oxide. The thickness of the substrate 21 is about 0.1 to 1.0 mm.

A titanium-based layer 22 is coated on the ceramic substrate 21. The thickness of the titanium-based layer 22 is about 0.1 to 1.0 micrometer. The titanium-based layer 22 is used as a back contact and a seed layer. The titanium-based layer 22 is made of $TiSi_2$, TiN, TiC, $TiB_2$ or $TiC_xN_y$. The titanium-based layer 22 is crystalline. The size of the crystals of the titanium-based layer 22 is in the order of a micrometer. The sheet resistance of the titanium-based layer 22 is lower than $0.5\ \Omega/cm^2$.

Figure 3:
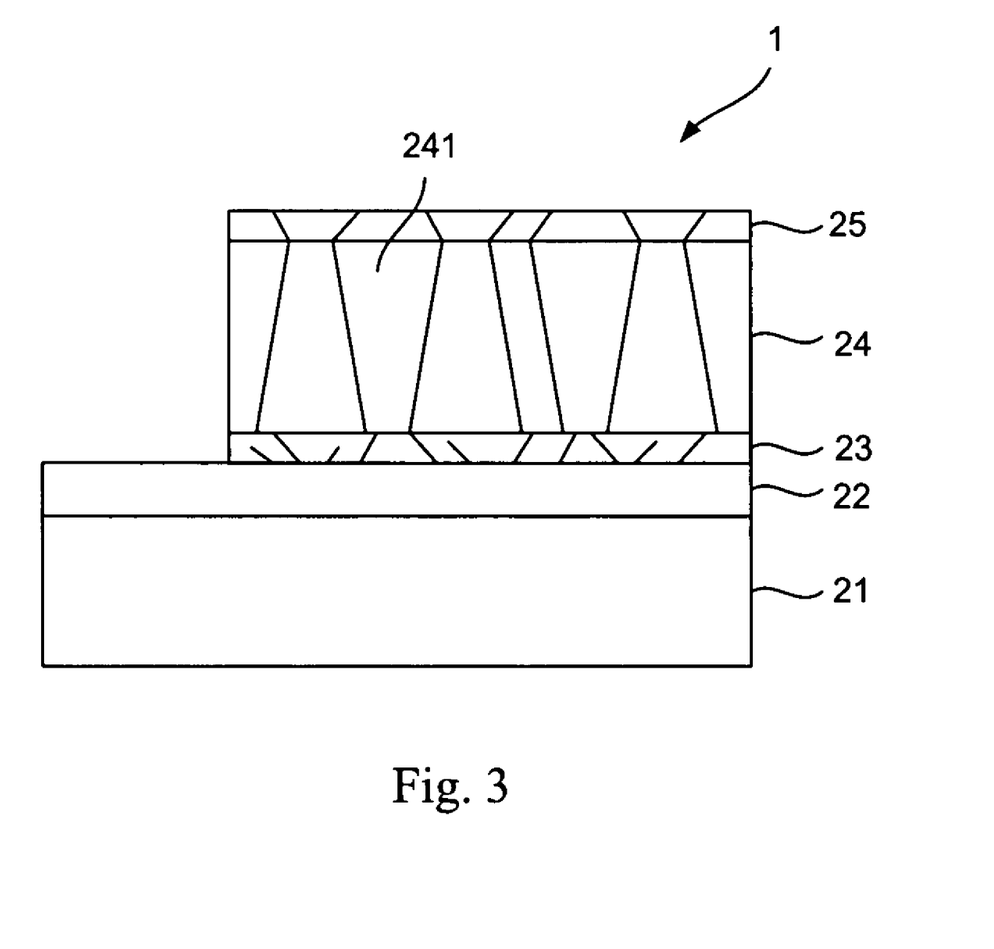
FIG. 3 is a side view of an $n^+$-$p^-$-$p^+$ laminate coated on the titanium-based layer shown in FIG. 2.

Referring to FIGS. 1 and 3, at 12, an $n^+$-p--$p^+$ laminate 1 is coated on the titanium-based layer 22. The forming of the $n^+$-$p^-$-$p^+$ laminate 1 will be described in detail.

In an atmospheric pressure chemical vapor deposition ("APCVD") device, at about 900 to 1000 degrees Celsius, dichlorosilane and diborane are deposited on the titanium-based layer 22. The dichlorosilane and diborane exchange silicon atoms and boron atoms, thus causing the epitaxial growth of a $p^+$-type back surface field ("BSF") layer 23 on the titanium-based layer 22. The thickness of the $p^+$-type BSF layer 23 is no larger than 1 micrometer.

Then, the temperature in the APCVD device is raised. At higher than 1000 degrees Celsius, for about 30 minutes, the dichlorosilane and the diborane continue to exchange silicon atoms and boron atoms, thus causing the epitaxial growth of a $p^-$-type light-soaking layer 24 on the BSF layer 23, which is used as a core layer. The rate of the epitaxial growth is about 0.5 micrometer/minute. The thickness of the $p^-$-type light-soaking layer 24 is about 1 to 15 micrometers. The size of silicon crystals 241 in the $p^-$-type light-soaking layer 24 is about 10 micrometers. The concentration of the boron atoms in the $p^-$-type light-soaking layer 24 is about $10^{16}$ to $10^{17}$ #/$cm^3$.

Then, at 800 to 1000 degrees Celsius, phosphine is diffusively deposited on the $p^-$-type light-soaking layer 24, thus causing $n^+$-type diffusive deposition of the phosphorous atoms of the phosphine on the $p^-$-type light-soaking layer 24. Thus, an $n^+$-type emitter 25 is coated on the $p^-$-type light-soaking layer 24. The concentration of the phosphorous atoms in the $n^+$-type emitter 25 is about $10^{18}$ to $10^{19}$ #/$cm^3$.

Figure 4:
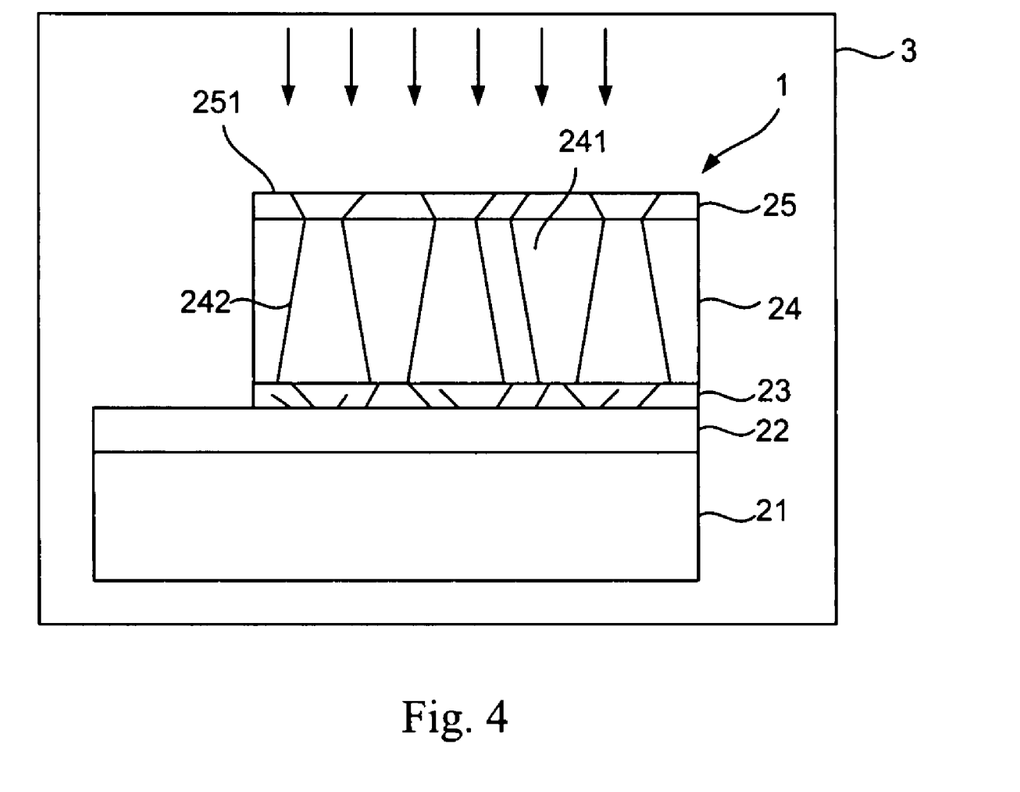
FIG. 4 is a side view of an atmospheric pressure chemical vapor deposition device for processing the laminate shown in FIG. 2.

Referring to FIGS. 1 and 4, at 13, in a plasma-enhanced chemical vapor deposition ("PECVD") device 3, at 13.56 MHz, silane, nitrous oxide and methane are used as materials of plasma while argon is used as a carrier. At the room temperature to 400 degrees Celsius, the plasma passivates the $n^+$-$p^-$-$p^+$ laminate 1. That is, the dangling bonds of the silicon atoms on a surface 251 of the $n^+$-type emitter 25 and the crystal boundaries 242 of the $p^-$-type light-soaking layer 24 are filled.

Figure 5:
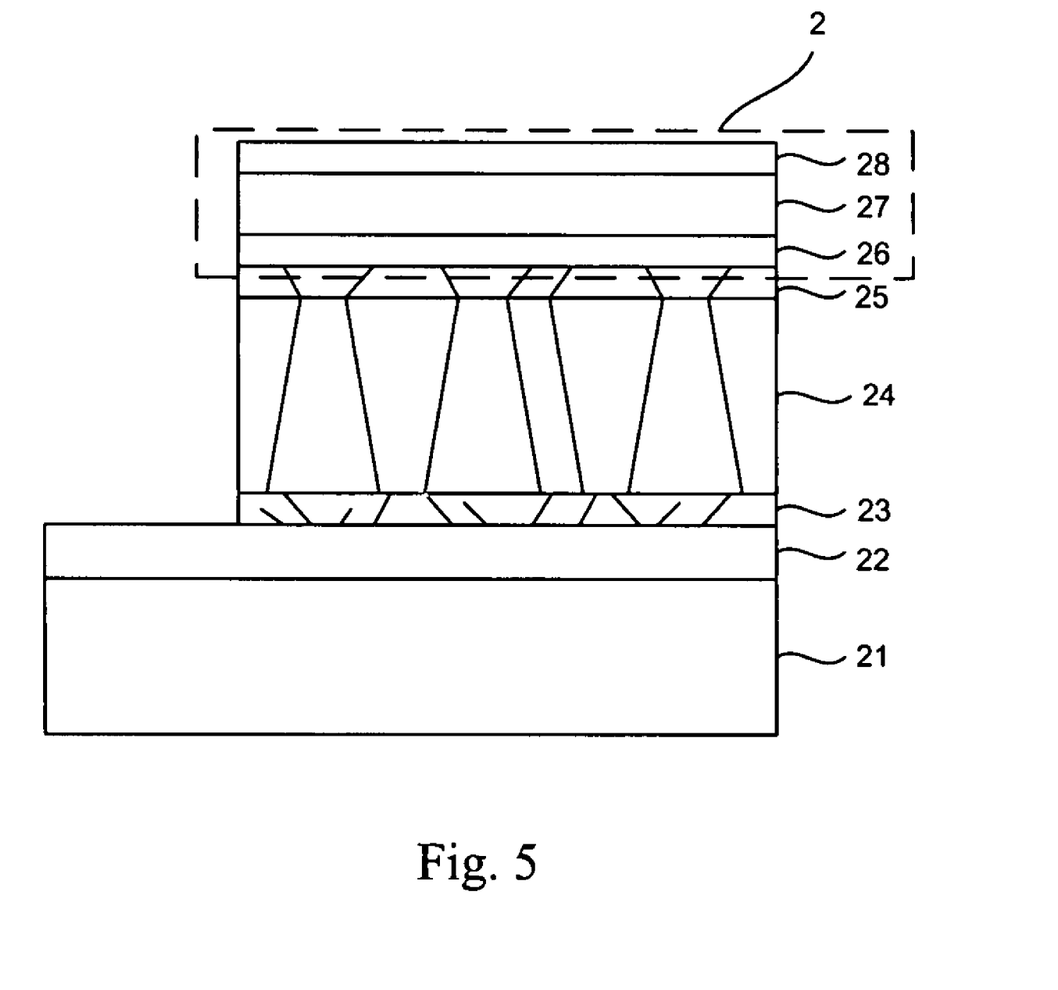
FIG. 5 is a side view of an n-i-p laminate coated on the laminate shown in FIG. 4.

Referring to FIGS. 1 and 5, at 12, an n-i-p laminate 2 is coated on the $n^+$-$p^-$-$p^+$ laminate 1. The forming of the n-i-p laminate 2 will be described in detail.

In a chemical vapor deposition ("CVD") device, dichlorosilane and diborane are deposited on the $n^+$-type emitter 25. The dichlorosilane and diborane exchange silicon atoms and boron atoms, thus causing the epitaxial growth of a p-type amorphous silicon carbide layer 26 on the $n^+$-type emitter 25.

Then, by inter-doping with non-reactive gas, an i-type amorphous silicon carbide intrinsic layer 27 is coated on the p-type amorphous silicon carbide layer 26.

Then, by n-type diffusion deposition of phosphine on the i-type amorphous silicon carbide intrinsic layer 27, an n-type amorphous silicon carbide layer 28 is coated on the i-type amorphous silicon carbide intrinsic layer 27.

Figure 6:
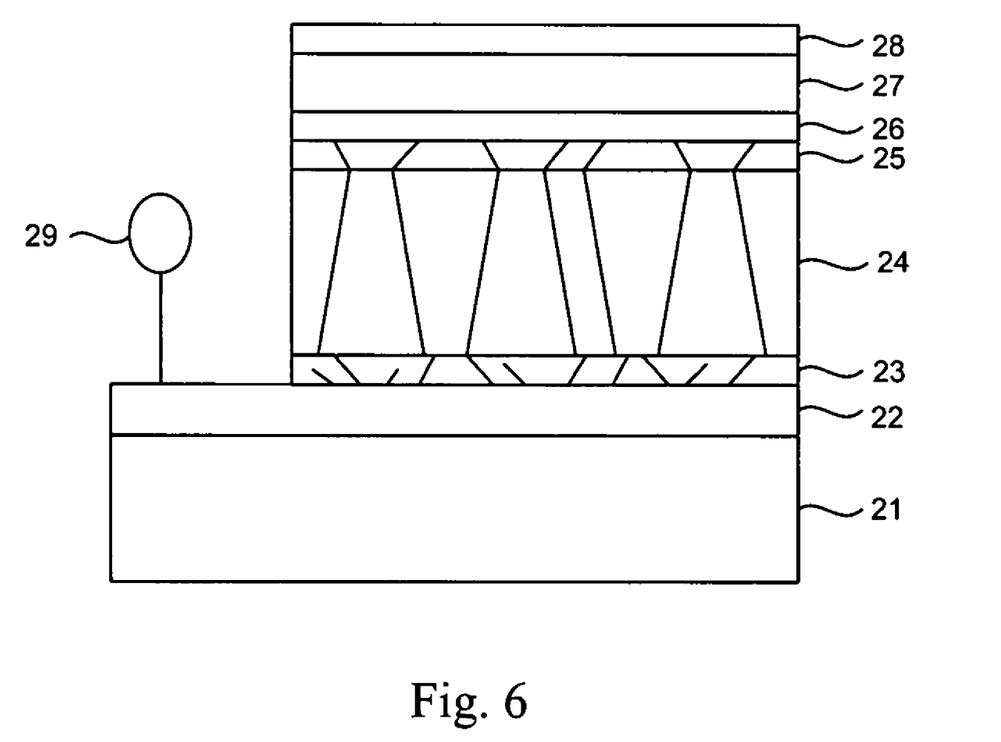
FIG. 6 shows a p-type ohmic contact of the laminate shown in FIG. 5.

Referring to FIGS. 1 and 6, at 15, potassium hydroxide solution and a patterned mask are used to etch a portion of the n-i-p laminate 2. The etching reaches an upper surface of the titanium-based layer 22 so that a p-type ohmic contact 29 can be provided on the upper surface of the titanium-based layer 2.

Figure 7:
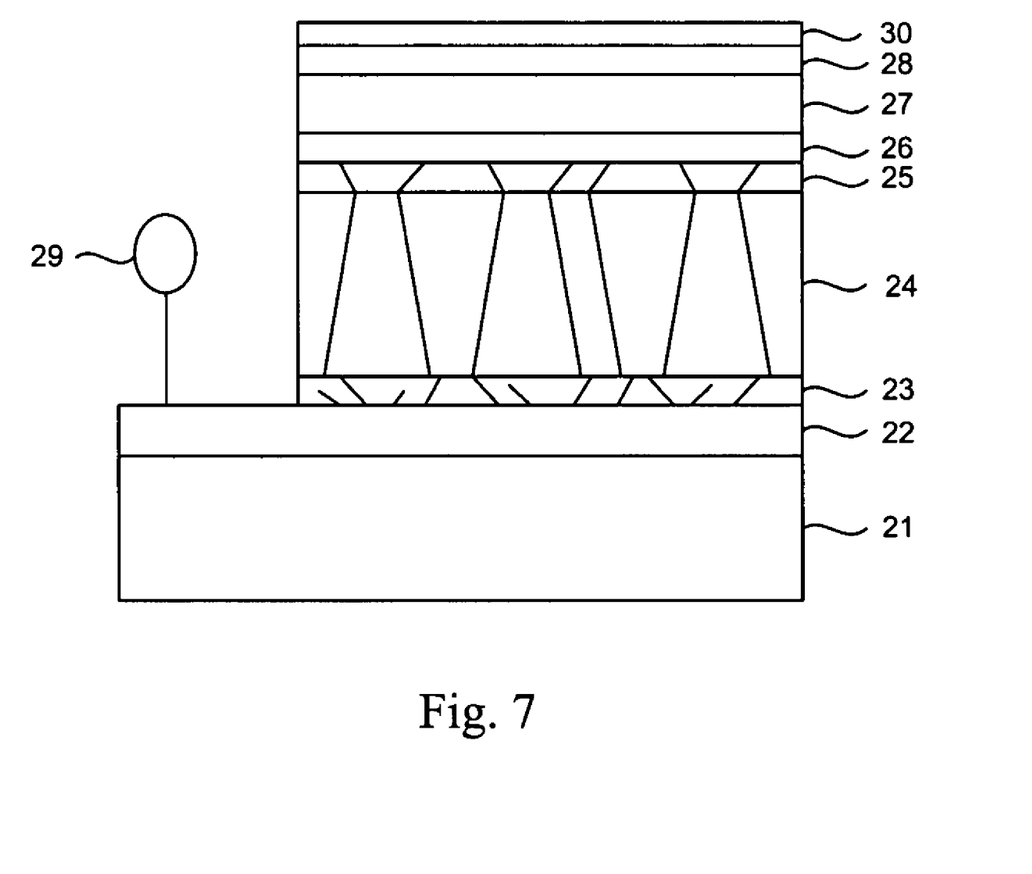
FIG. 7 is a side view of an anti-reflection layer coated on the laminate shown in FIG. 6.

Referring to FIGS. 1 and 7, at 16, a patterned mask is used to coat an on the n-type amorphous silicon carbide layer 28.

Figure 8:
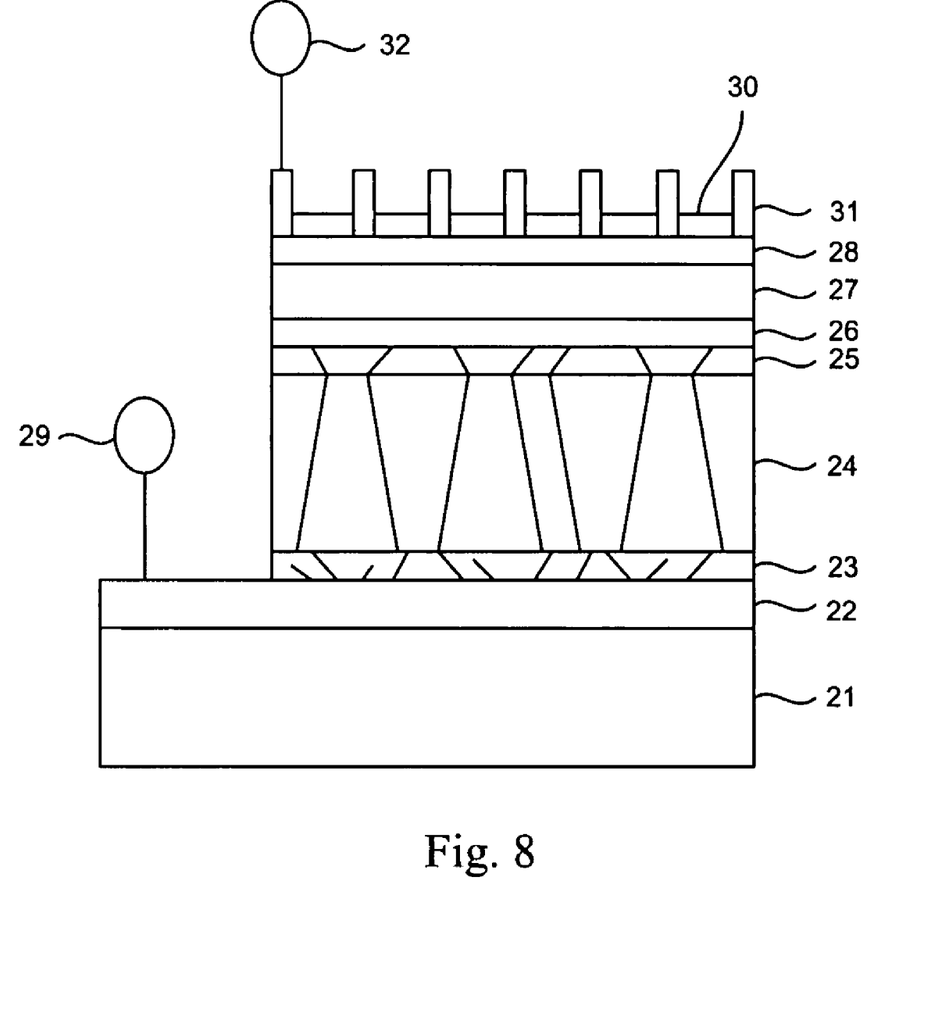
FIG. 8 shows an n-type ohm contact of the laminate shown in FIG. 7.
Figure 9:
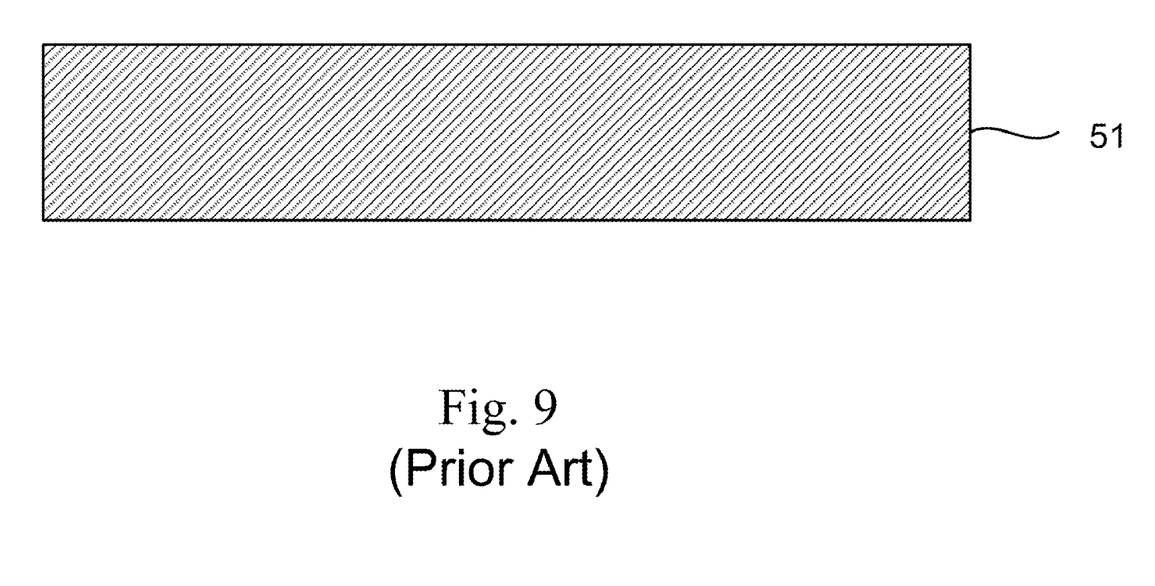
FIG. 9 is a side view of a substrate used in a conventional method for making a multi-crystalline silicon layer.
Figure 10:
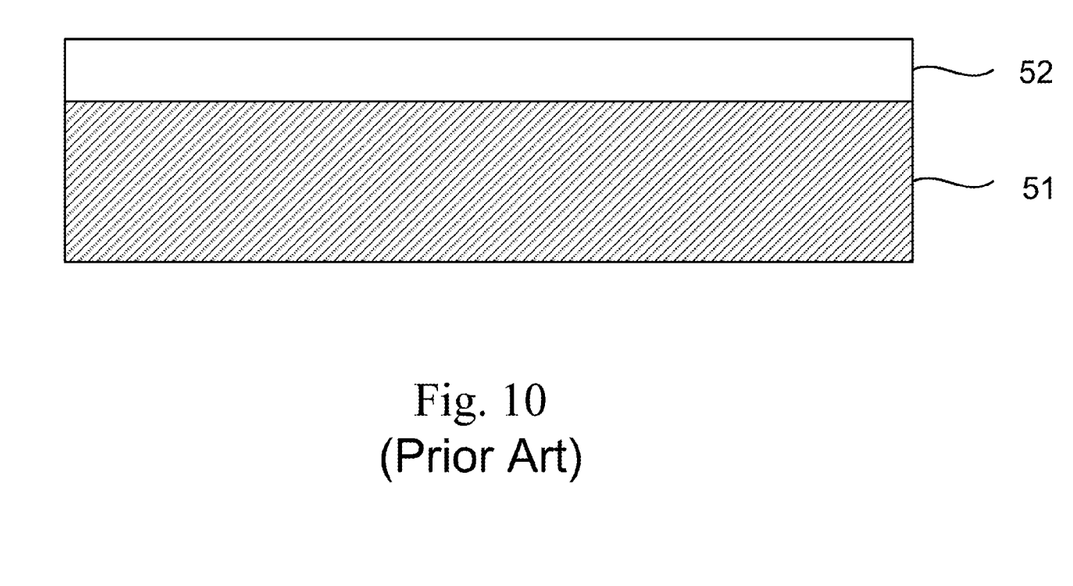
FIG. 10 is a side view of an aluminum layer coated on the substrate shown in FIG. 9.
Figure 11:
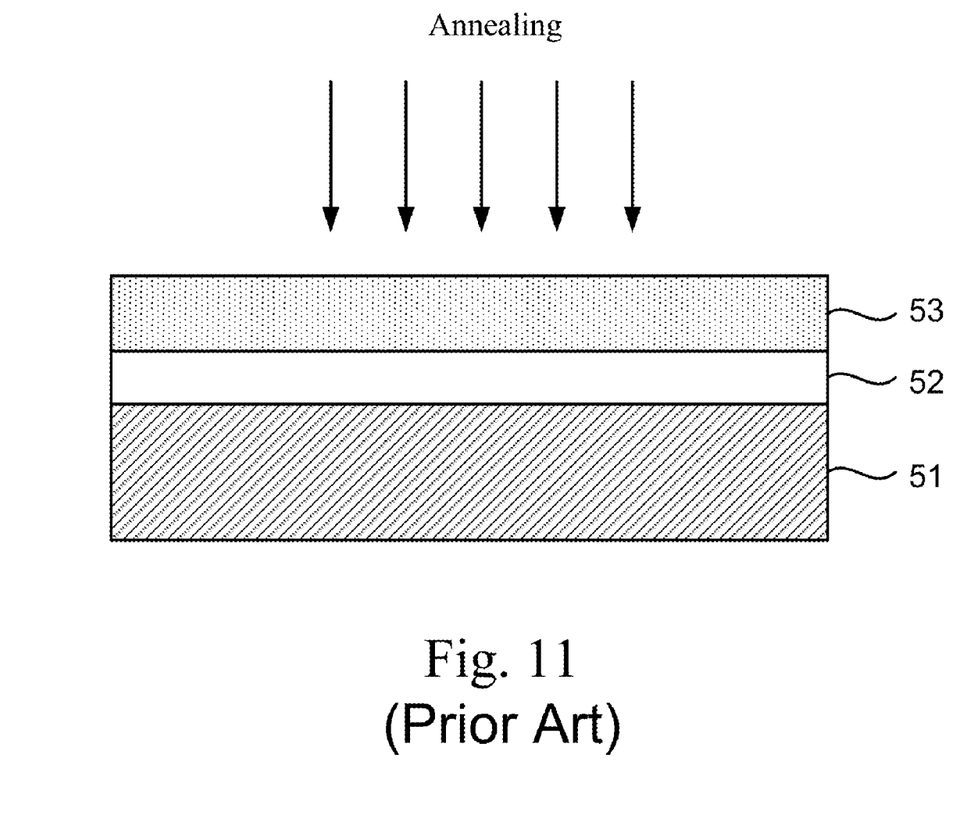
FIG. 11 is a side view of an amorphous silicon layer coated on the aluminum layer shown in FIG. 10.
Figure 12:
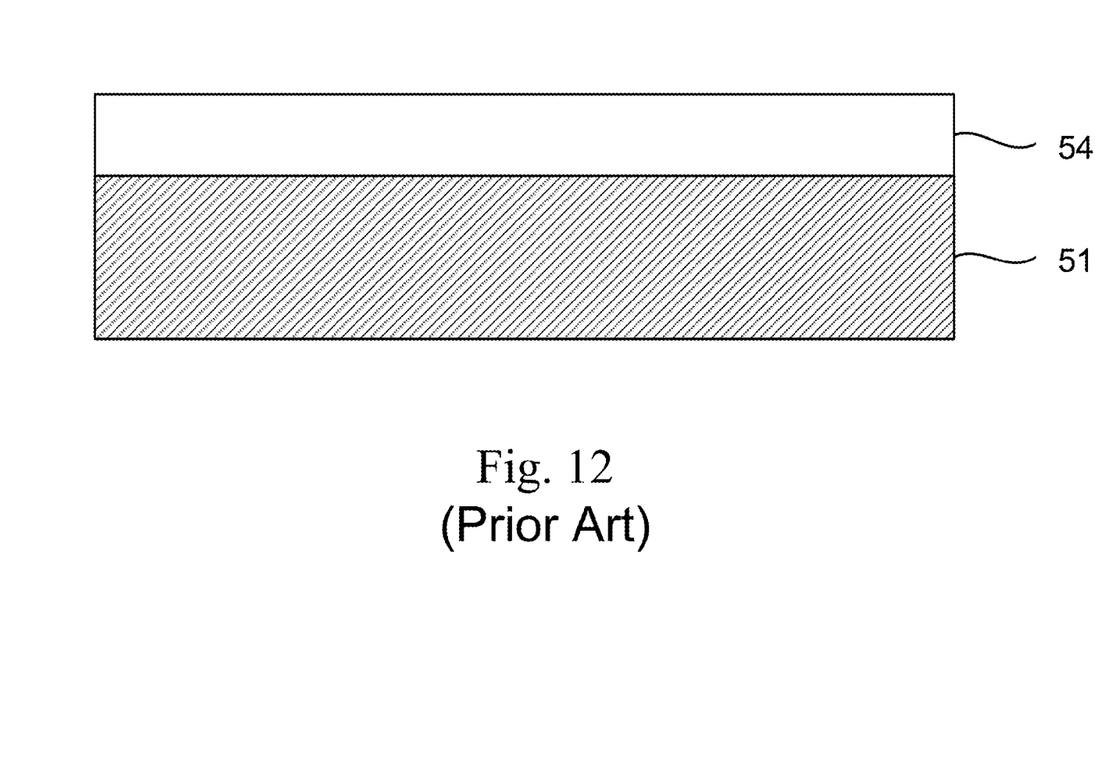
FIG. 12 is a side view of the substrate coated with a seed layer converted from the amorphous silicon layer and the aluminum layer of FIG. 11.
Figure 13:
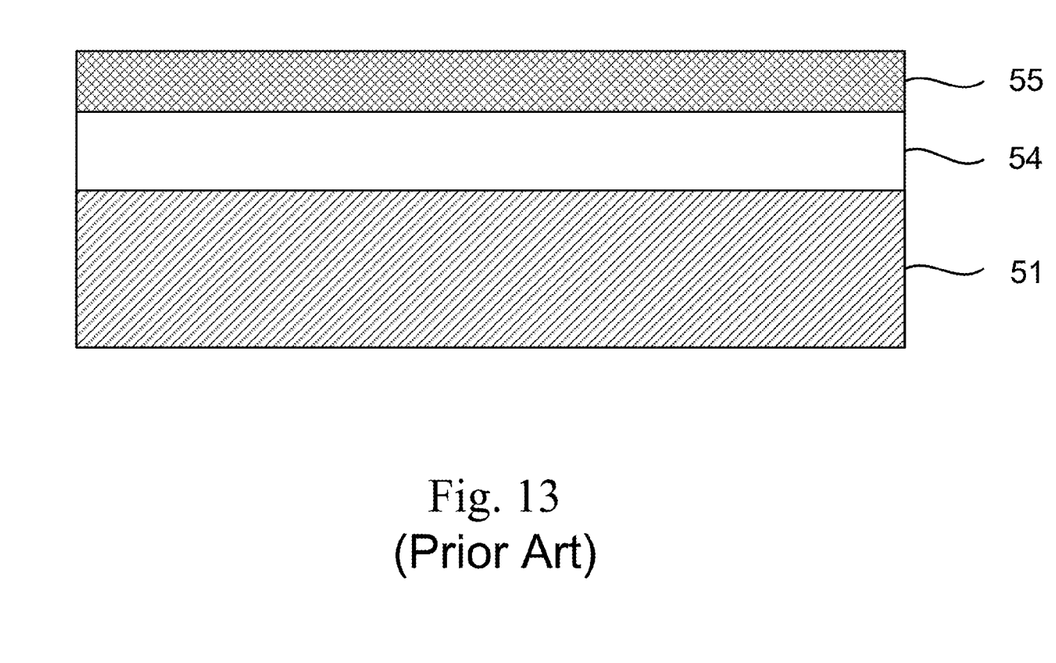
FIG. 13 is a side view of a multi-crystalline silicon layer coated on the seed layer shown in FIG. 12.

Referring to FIGS. 1 and 8, at 17; a patterned mask is used to etch a portion of the anti-reflection layer 30 of $SiCN/SiO_2$ so that portions of an upper surface of the amorphous silicon carbide layer 28 are exposed. Ti/Pd/Ag layers 31 are coated on the exposed portions of the amorphous silicon carbide layer 28. The Ti/Pd/Ag layers 31 are annealed at 500 degrees Celsius in an annealing oven. Thus, an n-type ohmic contact 32 is provided.

As discussed above, there is provided a tandem solar cell according to the preferred embodiment of the present invention. The tandem solar includes the substrate 21, the titanium-based layer 22, the $n^+$-$p^-$-$p^+$ laminate 1 and the n-i-p laminate 2.

According to the present invention, the chemical vapor deposition device is used in the high-temperature process. Therefore, the method of the present invention achieves a high epitaxial growth rate and a high crystal quality. Moreover, the cost of the equipment is reduced and the process is simplified.

According to the present invention, the tandem solar cell consists of the $n^+$-$p^-$-$p^+$ laminate 1 and the n-i-p laminate 2. The $n^+$-$p^-$-$p^+$ laminate 1 is made of the multi-crystalline silicon material with an energy gap of about 1.1 eV so that it can generate electricity from a spectrum of about 1200 to 600 angstroms, i.e., the infrared and visible light. The n-i-p laminate 2 is made of the amorphous silicon material with an energy gap of 2.0 eV so that it can generate electricity from a spectrum of about 800 to 300 angstroms, i.e., the visible and ultraviolet light. The tandem solar cell of the present invention can generate electricity from almost all of the spectrum of the sunlit, i.e., the photoelectric conversion efficiency is high. Furthermore, the energy gap of the amorphous silicon material is high so that the stability of the tandem solar cell is high.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A method for making a tandem solar cell comprising the steps of:
    providing a ceramic substrate;
    providing a titanium-based layer on the ceramic substrate;
    providing an $n^+$-$p^-$-$p^+$ laminate on the titanium-based layer by the steps of:
        using an atmospheric pressure chemical vapor deposition device to depose dichlorosilane and diborane on the titanium-based layer, thus causing the epitaxial growth of a $p^+$-type back surface field layer on the titanium-based layer;
        raising the temperature, thus causing the epitaxial growth of a $p^-$-type light-soaking layer on the $p^+$-type back surface field layer; and
        conducting $n^+$-type diffusive deposition of phosphine on the $p^-$-type light-soaking layer, thus forming an $n^+$-type emitter on the $p^-$-type light-soaking layer;
    using a plasma-enhanced chemical vapor deposition device to provide SiCNO:Ar plasma to passivate the $n^+$-$p^-$-$p^+$ laminate by filling the dangling bonds of the silicon atoms on the surface of the $n^+$-type emitter and on the crystalline boundaries of the $p^+$-type back surface field layer and the $p^-$-type light-soaking layer;
    providing an n-i-p laminate on the $n^+$-$p^-$-$p^+$ laminate by the steps of:
        using a chemical vapor deposition device to depose dichlorosilane and diborane on the $n^+$-type emitter, thus forming a p-type amorphous silicon carbide layer on the $n^+$-type emitter;
        conducting inter-doping with non-reactive gas to form an i-type amorphous silicon carbide intrinsic layer on the p-type amorphous silicon carbide layer; and
        conducting n-type diffusive deposition of phosphine on the i-type amorphous silicon carbide intrinsic layer to form an n-type amorphous silicon carbide layer on the i-type amorphous silicon carbide intrinsic layer;
    using potassium hydroxide solution and a patterned mask to etch a portion of the n-i-p laminate and providing a p-type ohmic contact;
    using a patterned mask to provide a Ti/Pd/Ag layer on the n-type amorphous silicon carbide layer and annealing the Ti/Pd/Ag layer in argon, thus forming an n-type ohmic contact; and
    using a patterned mask to provide an anti-reflection layer of $SiCN/SiO_2$ on the n-type amorphous silicon carbide layer.

2. The method according to claim 1, wherein the thickness of the ceramic substrate is about 0.1 to 1.0 mm.

3. The method according to claim 1, wherein the titanium-based layer is made of a material selected from a group consisting of $TiSi_2$, TiN, TiC, $TiB_2$ and $TiC_xN_y$.

4. The method according to claim 1, wherein the thickness of the titanium-based layer is about 0.1 to 1.0 micrometer.

5. The method according to claim 1, wherein the titanium-based layer is crystalline and comprises crystals in the order of a micrometer.

6. The method according to claim 5, wherein the titanium-based layer is used both as a back contact and a seed layer.

7. The method according to claim 1, wherein the sheet resistance of the titanium-based layer is smaller than 0.5 $\Omega/cm^2$.

8. The method according to claim 1, wherein the thickness of the $p^+$-type back surface field layer is no larger than 1 micrometer.

9. The method according to claim 1, wherein the thickness of the $p^-$-type light-soaking layer is about 1 to 15 micrometers, and the grain size of the $p^-$-type light-soaking layer is larger than 10 micrometers.

10. The method according to claim 1, wherein the thickness of the $n^+$-type emitter is about 0.1 micrometer.

* * * * *